US012633722B2

(12) United States Patent　　　　(10) Patent No.:　　US 12,633,722 B2
Iguchi　　　　　　　　　　　　　　　(45) Date of Patent:　　May 19, 2026

(54) LIGHT-EMITTING APPARATUS, LIGHT-EMITTING DEVICE, AND MEASURING APPARATUS

(71) Applicant: FUJIFILM Business Innovation Corp., Tokyo (JP)

(72) Inventor: Daisuke Iguchi, Kanagawa (JP)

(73) Assignee: FUJIFILM BUSINESS INNOVATION CORP., Tokyo (JP)

( * ) Notice: Subject to any disclaimer, the term of this patent is extended or adjusted under 35 U.S.C. 154(b) by 300 days.

(21) Appl. No.: 17/967,151

(22) Filed: Oct. 17, 2022

(65) Prior Publication Data

US 2023/0246413 A1　　Aug. 3, 2023

(30) Foreign Application Priority Data

Feb. 2, 2022　　(JP) ................................. 2022-014955

(51) Int. Cl.
*H01S 5/042*　　　　(2006.01)
*G01B 11/24*　　　　(2006.01)

(52) U.S. Cl.
CPC .............. *H01S 5/042* (2013.01); *G01B 11/24* (2013.01)

(58) Field of Classification Search
CPC ..... G01B 11/24; G01S 17/894; G01S 7/4815; G01S 7/484; H01L 2924/12041; H01L 2924/12042; H01L 2924/12043; H01L 2924/12044; H01L 2924/1205; H10K 50/11; H10K 59/12
USPC ........................................................ 356/601
See application file for complete search history.

(56) References Cited

U.S. PATENT DOCUMENTS

| | | | |
|---|---|---|---|
| 9,054,485 B1 | 6/2015 | Ng | |
| 2004/0233148 A1* | 11/2004 | Tanghe | G09G 3/3283 |
| | | | 345/83 |
| 2016/0344156 A1 | 11/2016 | Rothberg et al. | |
| 2020/0328576 A1* | 10/2020 | Sakai | G02B 27/4205 |
| 2020/0366062 A1* | 11/2020 | Iguchi | H01S 5/02345 |
| 2021/0265809 A1* | 8/2021 | Iguchi | H01S 5/18302 |
| 2022/0209500 A1* | 6/2022 | Cheung | H01S 5/0428 |

FOREIGN PATENT DOCUMENTS

| | | |
|---|---|---|
| JP | 2020-205390 A | 12/2020 |
| JP | 2021-022689 A | 2/2021 |
| JP | 2022-137839 A | 9/2022 |
| WO | 2020/194773 A1 | 10/2020 |

OTHER PUBLICATIONS

Oct. 28, 2025 Office Action issued in Japanese Application No. 2022-014955.
Mar. 17, 2026 Office Action issued in Japanese Application No. 2022-014955.

* cited by examiner

*Primary Examiner* — Sunghee Y Gray
(74) *Attorney, Agent, or Firm* — Oliff PLC

(57)　　　　　　　　ABSTRACT

A light-emitting apparatus includes: a light-emitting unit including a light-emitting element; a drive unit including a first element connected to a cathode electrode provided on a cathode side of the light-emitting element, the drive unit being configured to drive the light-emitting element by supplying current that causes light emission; and a capacitive unit provided in parallel with a route of current that causes light emission, between an anode electrode provided on an anode side of the light-emitting element and the cathode electrode.

3 Claims, 10 Drawing Sheets

10

VCSEL

101

101A

101B 102,102A,102B

LIGHT-EMITTING APPARATUS, LIGHT-EMITTING DEVICE, AND MEASURING APPARATUS

CROSS-REFERENCE TO RELATED APPLICATIONS

This application is based on and claims priority under 35 USC 119 from Japanese Patent Application No. 2022-014955 filed Feb. 2, 2022.

BACKGROUND

(i) Technical Field

The present disclosure relates to a light-emitting apparatus, a light-emitting device, and a measuring apparatus.

(ii) Related Art

Japanese Unexamined Patent Application Publication No. 2020-205390 discloses, as a light-emitting apparatus in which the inductance of a drive circuit is reduced compared to a configuration in which a capacitive element that supplies a drive current to a light-emitting element is provided on a substrate, a light-emitting apparatus including: a substrate; a light-emitting element, a drive element configured to drive the light-emitting element, and drive wiring configured to connect the light-emitting element and the drive element, which are provided on the substrate; and a capacitive element that is provided inside the substrate so as to at least partially overlap the drive wiring in a plan view, and that supplies a drive current to the light-emitting element via internal wiring inside the substrate opposite the drive wiring.

In recent years, Time of Flight (ToF) sensors have become the mainstream ranging sensors used for object recognition and the like, and light-emitting elements such as vertical cavity surface emitting lasers (VCSELs) are used as their light sources.

In order to use ToF sensors in applications for mobile devices such as smartphones, it is necessary to achieve both high spatial resolution and power saving. To do so, it may be required to simultaneously switch multiple light-emitting elements in parallel using a drive current of a few A and a high-speed pulse whose rise time/fall time is below ns order. Here, if the cathode side is connected to an element, an ideal open-drain element performs constant current operations; however, in an element with a realistic configuration, the drain voltage drops due to the parasitic inductance of the route of a drive current at the time of rising, and it takes a long time from when the current is first consumed by light emission until a predetermined power is reached.

SUMMARY

Aspects of non-limiting embodiments of the present disclosure relate to providing a light-emitting apparatus and the like in which the time from when current is first consumed by light emission until a predetermined power is reached is short.

Aspects of certain non-limiting embodiments of the present disclosure address the above advantages and/or other advantages not described above. However, aspects of the non-limiting embodiments are not required to address the advantages described above, and aspects of the non-limiting embodiments of the present disclosure may not address advantages described above.

According to an aspect of the present disclosure, there is provided a light-emitting apparatus including: a light-emitting unit including a light-emitting element; a drive unit including a first element connected to a cathode electrode provided on a cathode side of the light-emitting element, the drive unit being configured to drive the light-emitting element by supplying current that causes light emission; and a capacitive unit provided in parallel with a route of current that causes light emission, between an anode electrode provided on an anode side of the light-emitting element and the cathode electrode.

BRIEF DESCRIPTION OF THE DRAWINGS

Exemplary embodiments of the present disclosure will be described in detail based on the following figures, wherein.

DETAILED DESCRIPTION

Hereinafter, exemplary embodiments of the present disclosure will be described in detail with reference to the accompanying drawings.

A measuring apparatus that measures the three-dimensional shape or the like of a measurement target based on the ToF method measures the distance to the measurement target based on the time from when light is emitted from a light-emitting apparatus included in the measuring apparatus to when the emitted light is reflected at a detection target and received by a three-dimensional sensor (hereinafter may also be represented as a "3D sensor") included in the measuring apparatus, and measures the three-dimensional shape. Note that the 3D sensor is an example of a light-receiving unit.

The ToF method includes an indirect ToF (iToF) method for measuring time from the difference between the phase of the emitted light and the phase of the received light, and a direct ToF (dToF) method for directly measuring the time from the emission of light to the reception of light. The two methods will not be distinguished here and will be referred to as the ToF method.

In addition, the three-dimensional shape of a measurement target may be represented as a "three-dimensional image" or a "3D shape". Moreover, measurement of the three-dimensional shape may be represented as "three-dimensional measurement", "3D measurement", or "3D sensing".

Hereinafter, configurations, functions, methods, and the like described as exemplary embodiments of the present disclosure may be applied to facial authentication, augmented reality (AR), and other three-dimensional measurements in information processing apparatuses such as mobile devices.

In addition, they may be used not only for three-dimensional measurements, but also for simply measuring the distance to a measurement target.

First Exemplary Embodiment

Figure 1:
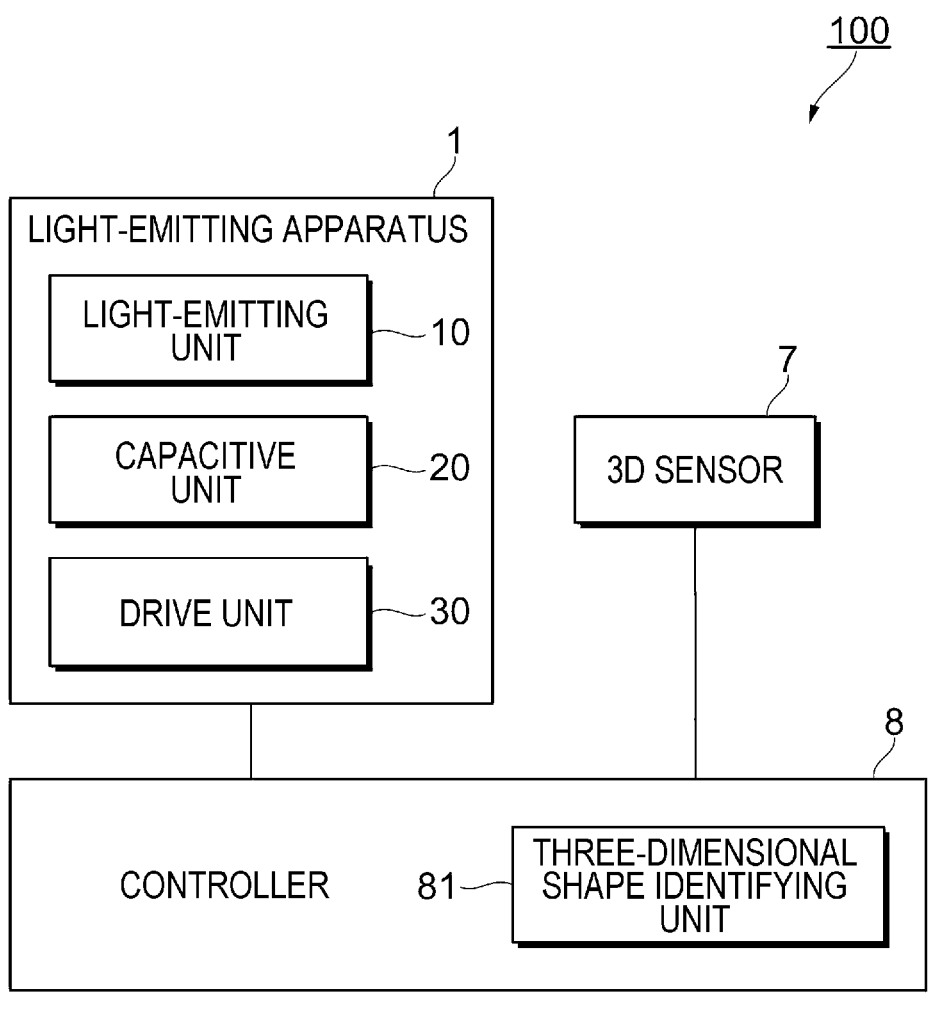
FIG. 1 is a block diagram illustrating the schematic configuration of a light-emitting apparatus to which a first exemplary embodiment is applied and a ToF sensor including the light-emitting apparatus.

Firstly, a first exemplary embodiment of the present disclosure will be described using FIGS. 1 to 6. FIG. 1 is a block diagram illustrating the schematic configuration of a light-emitting apparatus 1 to which the first exemplary embodiment is applied and a ToF sensor 100 including the light-emitting apparatus 1.

The ToF sensor 100 is an example of a measuring apparatus that measures the three-dimensional shape of a measurement target, and includes the light-emitting apparatus 1, a 3D sensor 7, and a system controller 8.

The light-emitting apparatus 1 is an apparatus that emits light for three-dimensional measurement by the ToF sensor 100.

The 3D sensor 7 receives light emitted by the light-emitting apparatus 1 and reflected back at the measurement target. More specifically, the 3D sensor 7 includes a light-receiving element, and outputs a signal corresponding to the time from when the light-emitting apparatus 1 emits light to when the light is reflected at the measurement target and received by the light-receiving element.

The controller 8 controls the light-emitting apparatus 1 and the 3D sensor 7. In addition, the controller 8 includes a three-dimensional shape identifying unit 81, which identifies the three-dimensional shape of the measurement target based on the signal from the 3D sensor 7. The controller 8 is configured as, for example, a computer including a central processing unit (CPU), read-only memory (ROM), random-access memory (RAM), and the like, and the ROM includes a non-volatile rewritable memory such as flash memory. A program stored in the ROM is expanded in the RAM, and then is executed by the CPU, thereby configuring the three-dimensional shape identifying unit 81.

The light-emitting apparatus 1 includes a light-emitting unit 10, a capacitive unit 20, and a drive unit 30. The light-emitting unit 10 includes a VCSEL (described later using FIG. 2), which is an example of a light-emitting element, and is driven by the drive unit 30 to emit light. More specifically, when the VCSEL is driven with a current supplied from the drive unit 30 to emit light, light from the light-emitting unit 10 is emitted. Hereinafter, the current that drives the VCSEL to cause light emission may be represented as a "drive current".

The capacitive unit 20 has an electrostatic capacitance (electric capacitance) to accumulate and release electric charge. More specifically, with the drive current supplied from the drive unit 30, the capacitive unit 20 accumulates electric charge until an upper limit determined from the electrostatic capacitance is reached. Note that the electric charge accumulation by the capacitive unit 20 may be represented as charging, and the release of the electric charge may be represented as discharging.

The drive unit 30 includes an n-channel metal-oxide semiconductor (NMOS) element N1, which is an example of a first element, and a signal generation circuit V2, which switches on/off the NMOS element N1, and supplies a drive current. Note that the NMOS element N1 and the signal generation circuit V2 will be described later using FIG. 4.

Although FIG. 1 separately illustrates the light-emitting unit 10 and the capacitive unit 20, the light-emitting unit 10 and the capacitive unit 20 share a common portion in the first exemplary embodiment.

In other exemplary embodiments, the light-emitting unit 10 and the capacitive unit 20 may not share a common portion, and may be provided as independent members. Note that the case where the light-emitting unit 10 and the capacitive unit 20 do not share a common portion will be described in detail later as a fourth exemplary embodiment.

Figure 2:
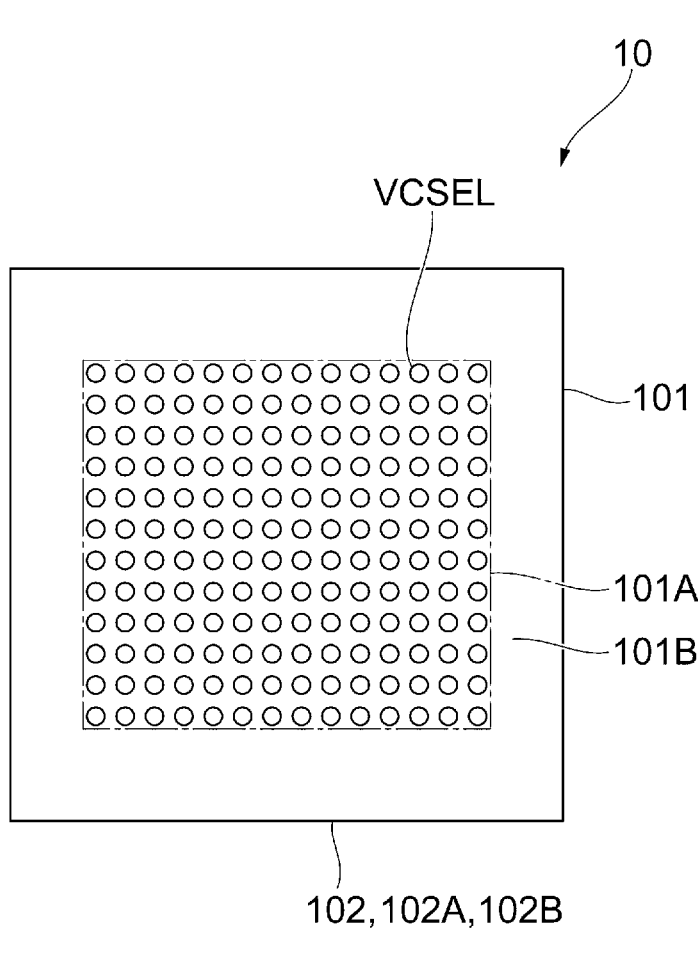
FIG. 2 is a diagram illustrating a light-emitting unit according to the first exemplary embodiment.
Figure 2:
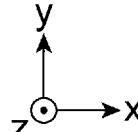

FIG. 2 is a diagram illustrating the light-emitting unit 10 according to the first exemplary embodiment, and is a plan view illustrating an example of the light-emitting unit 10. In FIG. 2, the right side of the page serves as the +x direction, the top side of the page as the +y direction, and the front side of the page as the +z direction.

Here, the front surface of the light-emitting unit 10 indicates the front side of the page in FIG. 2, that is, the surface on the +z direction side, and the back surface of the light-emitting unit 10 indicates the back side of the page, that is, the surface on the −z direction side.

As illustrated in FIG. 2, the light-emitting unit 10 is configured as a two-dimensional array in which a plurality of VCSELs are arranged in the x direction and y direction. The number of VCSELs included in the light-emitting unit 10 is one hundred to one thousand, for example. Note that the plurality of VCSELs are connected to each other in parallel and are driven in parallel. Note that the number of VCSELs may be set according to the required measurement distance and irradiation range, and it is only necessary for the light-emitting unit 10 to be provided with at least one VCSEL.

Each VCSEL is provided by laminating semiconductor layers causing light emission on a semiconductor substrate 120, and emits laser light in a direction (+z direction) perpendicular to the front surface. Note that the semiconductor substrate 120 and the semiconductor layers will be described later using FIG. 3.

An anode electrode 101, which is common to the plurality of VCSELs, is provided on the front surface of the light-emitting unit 10 so as to cover the upper portions of at least the VCSELs arranged in the light-emitting unit 10. Here, the upper portions of the VCSELs indicates the side where the VCSELs emit light, and indicates the front side (+z direction) of the page in FIG. 2.

The anode electrode 101 according to the first exemplary embodiment is provided extending outside the region covering the VCSELs. In other words, the anode electrode 101 includes a region 101A covering the upper portions of the VCSELs and a region 101B extending outside the region 101A, that is, not covering the VCSELs.

Here, the anode electrode 101 according to the first exemplary embodiment is provided so that the area of the region 101B will be 20% or more of the area of the region 101A. That is, the area of the entire anode electrode 101 is 1.2 times or more of the area of a region where the VCSELs are arranged in the light-emitting unit 10. In the present specification, unless otherwise noted, the "area" refers to the area of a planar shape in a plane perpendicular to the direction in which a VCSEL emits light. That is, the "area" refers to the area of a planar shape in the xy plane in FIG. 2.

A cathode electrode 102, which is common to the plurality of VCSELs, is provided on the back surface of the light-emitting unit 10. In FIG. 2, since the cathode electrode 102 is not visible because it is covered by the anode electrode 101, only the leader line and the reference numeral are illustrated.

In the first exemplary embodiment, the cathode electrode 102 is provided in the same planar shape as the anode electrode 101. That is, the cathode electrode 102 has a rectangular shape with the same length in the x-direction and in the y-direction as the anode electrode 101.

The cathode electrode 102 includes a region 102A covering the lower portions (−z direction) of the VCSELs and a region 102B extending outside the region covering the VCSELs. Moreover, the region 101A and the region 102A have the same planar shape, and the region 101B and the region 102B have the same planar shape. That is, in the cathode electrode 102, the area of the region 102B is 20% or more of the area of the region 102A.

Since the anode electrode 101 and the cathode electrode 102 are provided facing each other, the region 101A and the region 102A face each other. Similarly, the region 101B and the region 102B face each other.

In the light-emitting apparatus 1, light emitted from the light-emitting unit 10 is expanded in a direction that intersects the direction (+z direction) in which light is emitted from an optical member (not illustrated). As the optical member, a diffuser plate provided on the path of light and diffusing light by scattering or the like, a diffractive optical element (DOE) and/or a lens that emits light by changing the angle of incident light, or the like is used.

Figure 3:
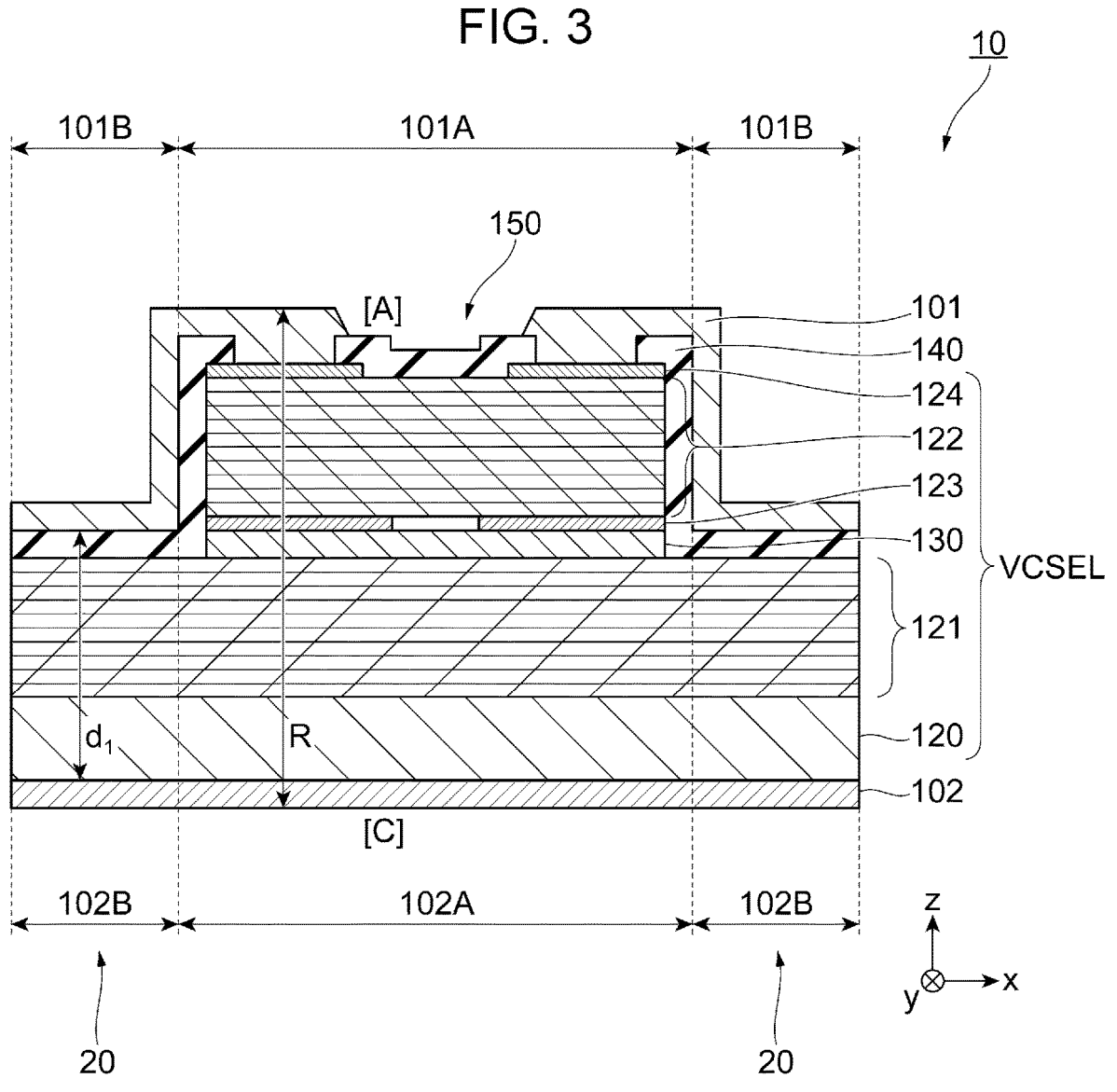
FIG. 3 is a diagram illustrating the cross-sectional structure of the light-emitting unit according to the first exemplary embodiment.

FIG. 3 is a diagram illustrating the cross-sectional structure of the light-emitting unit 10 according to the first exemplary embodiment, and the right side of the page is the +x direction, the back side of the page is the +y direction, and the upper side of the page is the +z direction. In FIG. 3, [A] indicates the anode side, and [C] indicates the cathode side of a VCSEL.

FIG. 3 illustrates the cross-sectional structure in the case where the light-emitting unit 10 has only one VCSEL. As illustrated in FIG. 3, the light-emitting unit 10 includes a VCSEL including a plurality of semiconductor layers, an insulating film 140, the anode electrode 101, and the cathode electrode 102.

Note that, in FIG. 3, the same portions as those in FIGS. 1 and 2 are denoted by the same reference numerals, and descriptions thereof may be omitted.

In the example illustrated in FIG. 3, the VCSEL has a resonator structure on the semiconductor substrate 120 of n-type Gallium arsenide (GaAs) or the like, in which an n-type lower reflector 121, an active layer 130 including a quantum well layer sandwiched between spacer layers, and a p-type upper reflector 122 are laminated in sequence.

The lower reflector 121 and the upper reflector 122 are distributed Bragg reflectors (DBRs) having alternating layers of aluminium gallium arsenide (AlGaAs) with different aluminium compositions. The active layer 130 is configured by providing, for example, a quantum well layer of GaAs/ AlGaAs or the like sandwiched between two spacer layers of AlGaAs or the like.

In the VCSEL illustrated in FIG. 3, a current narrowing layer 123, which concentrates current in the center of the resonator structure, is provided between the light-emitting layer (active layer) 130 and the upper reflector 122.

Furthermore, the upper side (+z direction) of the upper reflector 122 is provided with a p-type electrode 124, which is in ohmic contact with the upper reflector 122. The p-type electrode 124 is formed of, for example, a multilayer body made of a metal such as titanium gold (Ti/Au).

The insulating film 140 is provided to expose a portion of the p-type electrode 124 and to cover the surface of the VCSEL. The anode electrode 101 is provided to cover the VCSEL and the insulating film 140. Therefore, as illustrated in FIG. 3, the p-type electrode 124 is in contact with and is electrically connected to the anode electrode 101 in the portion exposed from the insulating film 140.

As described using FIG. 2, the anode electrode 101 has the region 101A covering the upper portion of the VCSEL and the region 101B extending outside the region 101A. The cathode electrode 102 has the region 102A covering the lower portion of the VCSEL and the region 102B extending outside the region 102A. The region 101B and the region 102B face each other at a distance $d_1$.

The p-type electrode 124 and the anode electrode 101 are provided with a light outlet 150 for allowing the light from the VCSEL to exit. In addition, the insulating film 140 is formed so as not to cover the light outlet 150. Moreover, the cathode electrode 102 is provided as an n-type electrode at the bottom (−z direction) of the semiconductor substrate 120.

In the case where the light-emitting unit 10 includes a plurality of VCSELs, the anode electrode 101 is provided to be shared by the plurality of VCSELs. That is, the p-type electrodes 124 of the plurality of VCSELs are connected in parallel by the anode electrode 101. Moreover, the plurality of VCSELs are formed on the common semiconductor substrate 120. That is, the plurality of VCSELs are connected in parallel by the cathode electrode 102 provided at the bottom of the semiconductor substrate 120.

As mentioned above, the light-emitting unit 10 includes the VCSEL, the anode electrode 101 provided on the anode side [A], and the cathode electrode 102 provided on the cathode side [C] of the VCSEL. In response to a supply of drive current between the anode electrode 101 and the cathode electrode 102, the VCSEL becomes luminous and emits light.

Note that the electrical connection from the anode electrode 101 to the cathode electrode 102 via the VCSEL is an example of the route of current that causes the light emission of the VCSEL, and serves as a drive current route R.

As described with reference to FIGS. 2 and 3, the regions 101B and 102B face each other at the distance $d_1$, which may be regarded as two conductors facing each other across a dielectric body.

Two conductors facing each other across a dielectric body have an electrostatic capacitance C indicated in equation (1). Note that $\varepsilon_0$ in equation (1) indicates the dielectric constant of vacuum, $\varepsilon_1$ indicates the dielectric constant of the dielectric body, d indicates the distance between the conductors, and S indicates the area of a portion where the two conductors face each other:

$$C = \varepsilon_0 \cdot \varepsilon_1 \cdot \frac{S}{d} \tag{1}$$

Therefore, the region 101B and the region 102B have an electrostatic capacitance $C_1$ determined according to the ratio of an area $S_1$ of the portion where the region 101B and the region 102B face each other and the distance $d_1$, and function as the capacitive unit 20. In addition, the region 101B and the region 102B are regions having the electrostatic capacitance $C_1$ and are examples of a capacitive region.

The capacitive unit 20 is provided in parallel with the drive current route R. Moreover, the capacitive unit 20 according to the first exemplary embodiment shares the anode electrode 101 and the cathode electrode 102 with the light-emitting unit 10.

Since the electrostatic capacitance $C_1$ is determined according to the ratio $S_1/d_1$ of the area $S_1$ and the distance $d_1$, the ratio $S_1/d_1$ is changed by changing the shape, size, and positional relationship of each member of the light-emitting apparatus 1, thereby changing the electrostatic capacitance $C_1$.

Here, in a measuring apparatus based on the ToF method, for driving a light-emitting element included in a light-emitting apparatus, from the viewpoint of improving the drive speed, the so-called low-side driving is general, which is performed by connecting the anode side of the light-emitting element to a power supply potential and connecting the cathode side to a driver such as an open-drain NMOS element.

Figure 4:
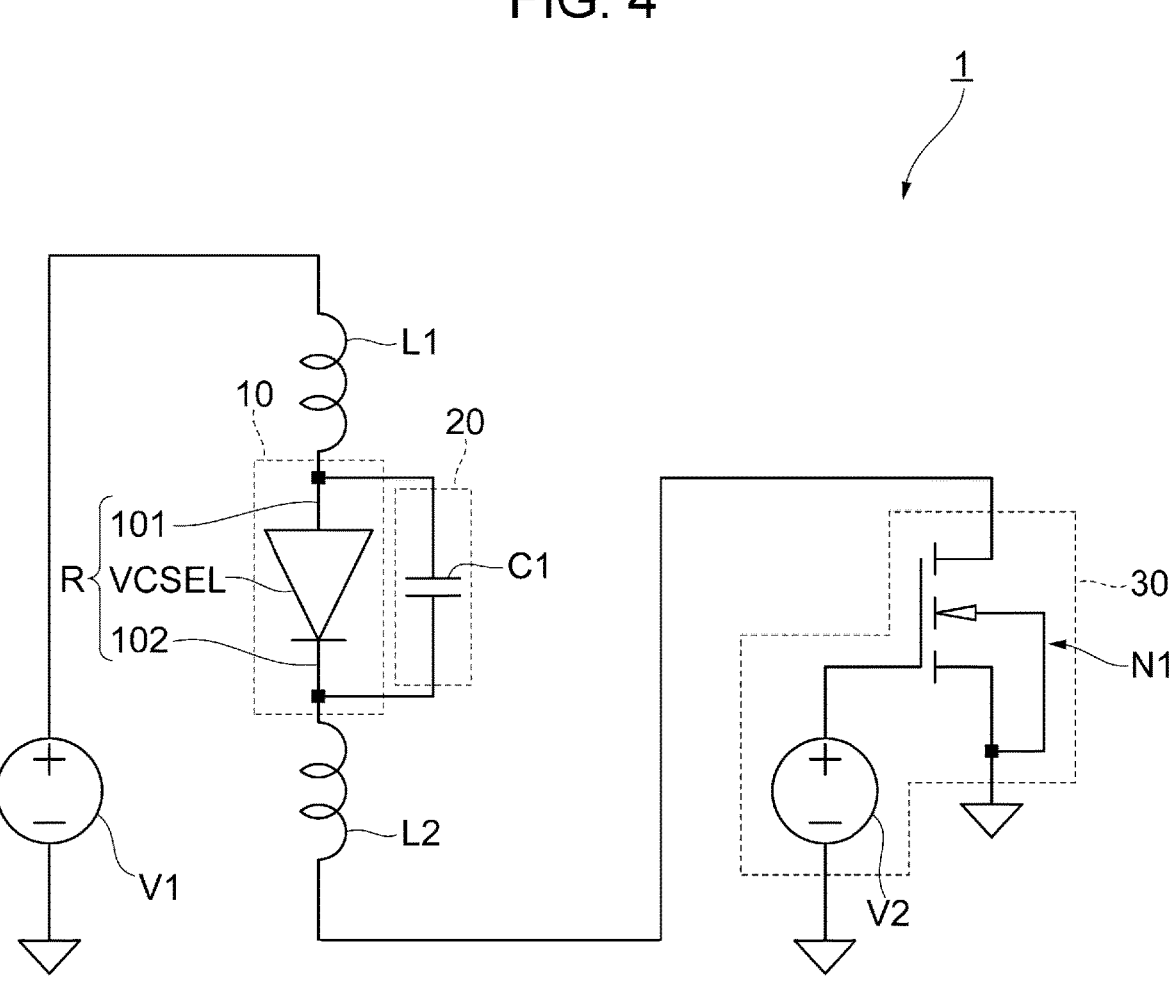
FIG. 4 is an equivalent circuit diagram in which the light-emitting apparatus to which the first exemplary embodiment is applied is low-side driven.

FIG. 4 is an equivalent circuit diagram in the case where the light-emitting apparatus 1 to which the first exemplary embodiment is applied is low-side driven. FIG. 4 illustrates the light-emitting unit 10, the capacitive unit 20, and the drive unit 30 of the light-emitting apparatus 1, and a power supply V1.

FIG. 4 illustrates an exemplary case in which the light-emitting unit 10 includes only one VCSEL, as in FIG. 3. As described above, in the case where the light-emitting unit 10 includes a plurality of VCSELs, the VCSELs are connected in parallel. Note that, in FIG. 4, the same portions as those in FIGS. 1 to 3 are denoted by the same reference numerals, and descriptions thereof may be omitted.

In FIG. 4, a capacitance C1 is illustrated for convenience, corresponding to the electrostatic capacitance $C_1$ of the capacitive unit 20, and does not indicate an individually provided capacitor.

In addition, inductances L1 and L2 are illustrated for convenience, corresponding to the parasitic inductance of the drive current route, and do not indicate individually provided inductors. More specifically, the inductance L1 corresponds to the parasitic inductance of the route from the power supply V1 to the anode side of the VCSEL. The inductance L2 corresponds to the parasitic inductance of the route from the cathode side of the VCSEL to the NMOS element N1 of the drive unit 30.

The power supply V1 is connected to the anode side of the VCSEL and supplies a power supply potential. The power supply V1 generates a direct current (DC) voltage with the + side as a power supply potential and the – side as a reference potential. The reference potential may be the ground potential (sometimes represented as GND).

Note that the power supply V1 is provided in, for example, the controller 8 illustrated in FIG. 1.

The light-emitting unit 10 includes the anode electrode 101, the VCSEL, and the cathode electrode 102, as described above, and forms the route R for causing the light emission of the VCSEL. The anode electrode 101 is connected to the power supply V1, and the cathode electrode 102 is connected to the drain of the NMOS element N1 (described later) of the drive unit 30.

The capacitive unit 20 has the electrostatic capacitance $C_1$ (indicated as the capacitance C1 in FIG. 4) as described above, and is provided in parallel with the route R of the light-emitting unit 10.

The drive unit 30 includes the NMOS element N1 and the signal generation circuit V2, which generates a control signal for switching on/off the NMOS element N1.

The NMOS element N1 is an n-type MOS transistor. The drain of the NMOS element N1 is connected to the cathode electrode 102 of the VCSEL. The source of the NMOS element N1 is supplied with the reference potential. The gate of the NMOS element N1 is supplied with a control signal from the signal generation circuit V2. That is, the VCSEL and the NMOS element N1 are connected in series between the power supply V1 and the reference potential.

Under control of the controller 8 (see FIG. 1), the signal generation circuit V2 generates an "H level" control signal for switching on the NMOS element N1 and an "L level" control signal for switching off the NMOS element N1.

Next, the driving of the light-emitting apparatus 1 by low-side driving will be described.

Firstly, suppose that a control signal generated by the signal generation circuit V2 is at "L level". In this case, the NMOS element N1 is in the off state. That is, no current flows between the source and drain of the NMOS element N1. Therefore, no drive current is supplied to the VCSEL, and no light is emitted.

Next, when a control signal generated by the signal generation circuit V2 becomes "H level", the NMOS element N1 transitions from off to on. Then, a current flows between the source and drain of the NMOS element N1, and a drive current is supplied first to the capacitive unit 20. Then, when charge is accumulated in the capacitive unit 20 to an upper limit determined by the electrostatic capacitance $C_1$, the drive current from the NMOS element N1 is supplied to the route R. The capacitive unit 20 releases the charge, and current is supplied to the route R. That is, a drive current is supplied to the VCSEL to emit light.

When a control signal generated by the signal generation circuit V2 becomes "L level" again, the NMOS element N1 transitions from on to off. Then, the drive current no longer flows through the VCSEL, and the light emission stops.

As described above, every time a signal output from the signal generation circuit V2 transitions to "H level" and "L level", the NMOS element N1 is switched on and off, and the switching of the VCSEL is performed.

Figure 5:
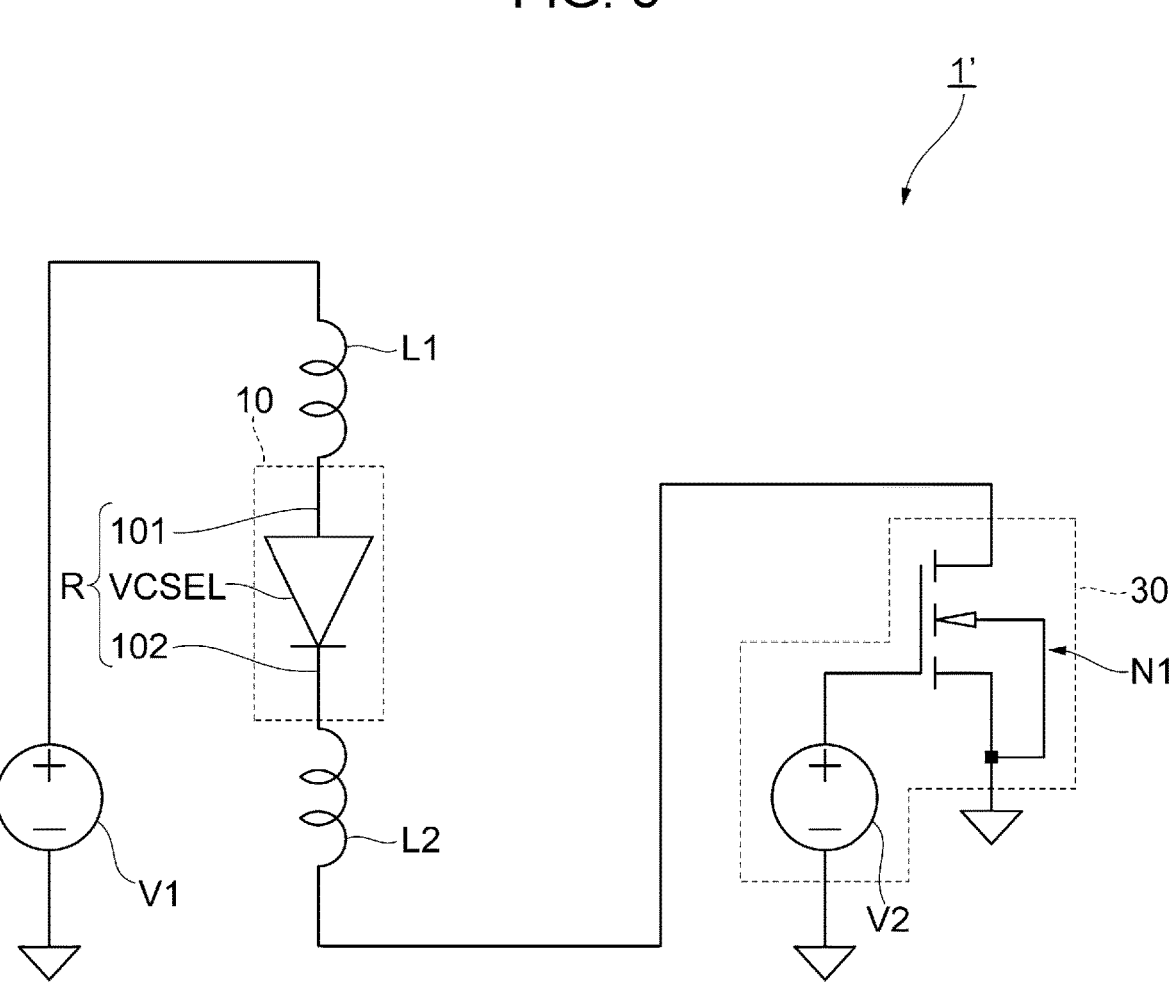
FIG. 5 illustrates a light-emitting apparatus to which the first exemplary embodiment is not applied for comparison.

FIG. 5 illustrates a light-emitting apparatus 1' to which the first exemplary embodiment is not applied for comparison.

The light-emitting apparatus 1' differs from the light-emitting apparatus 1 in the point that the light-emitting apparatus 1' does not have the region 101B and the region 102B. That is, as illustrated in FIG. 5, the light-emitting apparatus 1' does not have the capacitive unit 20 connected in parallel with the drive current route R.

Because other configurations are the same as or similar to those of the light-emitting apparatus 1 to which the first exemplary embodiment illustrated in FIG. 4 is applied, they are denoted by the same reference numerals, and descriptions thereof are omitted.

Since the light-emitting apparatus 1' does not have the capacitive unit 20, when a control signal of the signal generation circuit V2 becomes "H level" and the NMOS element N1 is switched on, current is supplied to the route R. That is, a drive current is supplied to the VCSEL to emit light.

In the following description, the light-emitting apparatus 1' not equipped with the capacitive unit 20 may be referred to as the "conventional light-emitting apparatus 1'".

Next, the switching of the VCSEL in the light-emitting apparatus 1 and in the conventional light-emitting apparatus 1' will be described in detail.

Figure 6:
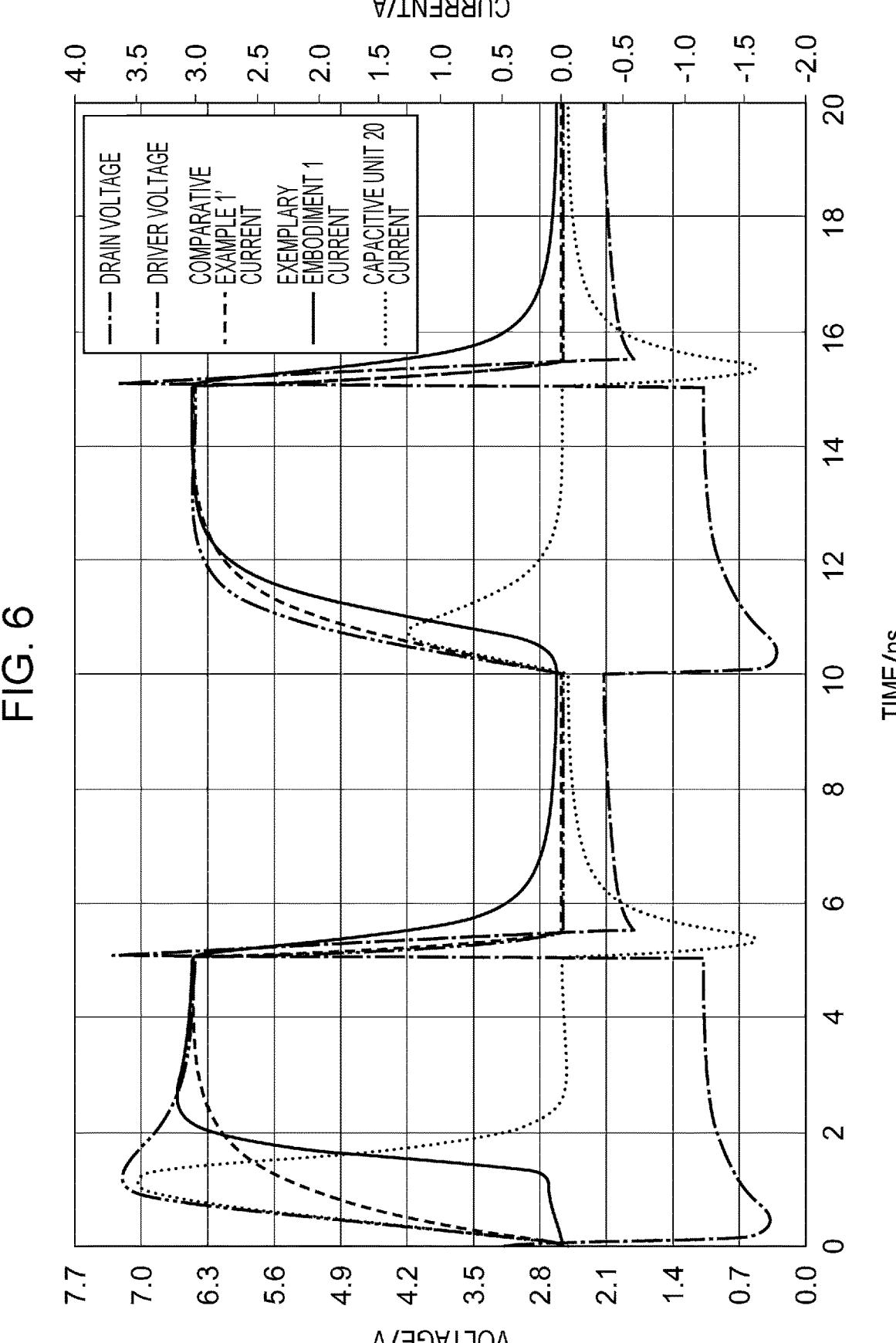
FIG. 6 illustrates the result of calculating a drive current flowing through a VCSEL in the light-emitting apparatus to which the first exemplary embodiment is applied and in the light-emitting apparatus to which the first exemplary embodiment is not applied.

FIG. 6 is a graph illustrating the result of calculating the drive current flowing through the VCSEL in the light-emitting apparatus 1 to which the first exemplary embodiment is applied and in the light-emitting apparatus 1' to which the first exemplary embodiment is not applied, in which the horizontal axis indicates time [ns] and the vertical axis indicates voltage [V] and current [A]. The solid line indicates the current flowing through the VCSEL of the light-emitting apparatus 1 ("exemplary embodiment 1 current" in the legend); the dashed line indicates the current flowing through the VCSEL of the conventional light-emitting apparatus 1' ("comparative example 1' current"); the dotted line indicates the current flowing through the capacitive unit 20 of the light-emitting apparatus 1 ("capacitive unit 20 current" in the legend); the dashed single-dotted line indicates the drain voltage of the NMOS element N1 ("drain voltage"); and the dashed double-dotted line indicates the current drawn by the NMOS element N1 of the light-emitting apparatus 1 ("driver current"). In the conventional light-emitting apparatus 1', since the current flowing through the VCSEL and the current drawn by the NMOS element N1 are equal, the dashed line in FIG. 6 may be regarded as a current drawn by the NMOS element N1 of the light-emitting apparatus 1'.

Note that FIG. 6 illustrates the results of calculation based on the following: in the light-emitting apparatuses 1 and 1' illustrated in FIGS. 4 and 5, the power supply potential of the power supply V1 is 3.3 V; the inductance L1 is 0.3 nH and the inductance L2 is 0.2 nH; and the control signal generated by the signal generation circuit V2 is 0 V at "L level" and 1.8 V at "H level", and the rise time of the pulse of the control signal is 0.5 ns, the fall time is 0.5 ns, the on time is 4.5 ns, and the cycle is 10 ns. That is, it is assumed that the signal generation circuit V2 generates a control signal with a pulse width of 5 ns, a duty ratio of 50%, and a cycle of 10 ns. Moreover, the results are calculated assuming that the electrostatic capacitance $C_1$ in the light-emitting apparatus 1 is 2000 pF.

In FIG. 6, the current flowing through the VCSEL of the light-emitting apparatus 1 (solid line) and the current flowing through the VCSEL of the conventional light-emitting apparatus 1' (dashed line) are compared. In the first pulse, the time from when the current is first consumed by the light emission of the VCSEL until a maximum value within the pulse is reached is shorter in the light-emitting apparatus 1 than in the conventional light-emitting apparatus 1'. That is, an increase in the current flowing through the VCSEL of the light-emitting apparatus 1 (solid line) is steeper than an increase in the current flowing through the VCSEL of the conventional light-emitting apparatus 1' (dashed line).

Therefore, the time from when the current is first consumed by the light emission of the VCSEL in the light-emitting apparatus 1 until a predetermined power is reached is shorter than that of the conventional light-emitting apparatus 1'. Note that the "predetermined power" refers to the light output required for the VCSEL, and corresponds to, for example, the light output necessary to satisfy the accuracy required for the ToF sensor 100.

The difference between the current flowing through the VCSEL of the light-emitting apparatus 1 (solid line) and the current flowing through the VCSEL of the conventional light-emitting apparatus 1' (dashed line) mentioned above will be described as follows.

Firstly, in the conventional light-emitting apparatus 1', the drain voltage of the NMOS element N1 (dashed single-dotted line) is lowered, due to the inductances L1 and L2 of the current route, to be smaller than a saturation potential (about 1 V in the example illustrated in FIG. 6). The NMOS element N1 is unable to perform a constant current operation until responses to the inductances L1 and L2 are completed, and an increase in the current drawn by the NMOS element N1 (dashed line) becomes moderate. That is, an increase in the current flowing through the VCSEL (dashed line) becomes moderate.

Here, the "saturation potential" is a source-drain potential necessary for the NMOS element N1 to perform a constant current operation of drawing a constant current. That is, the NMOS element N1 performs a constant current operation if the drain voltage is greater than or equal to the saturation potential, and does not perform a constant current operation if the drain voltage is smaller than the saturation potential.

In contrast, as indicated as a current flowing through the capacitive unit 20 (dotted line), the current drawn by the NMOS element N1 of the light-emitting apparatus 1 (dashed double-dotted line) first charges the capacitive unit 20. Then, after the capacitive unit 20 is charged to an upper limit determined by the electrostatic capacitance $C_1$, the current flows to the VCSEL and begins to be consumed by light emission. Therefore, there is a delay from when the NMOS element N1 begins to draw current to when the current begins to flow through the VCSEL. That is, there is a delay from the start of responses to the inductances L1 and L2 of the current route until the current begins to flow through the VCSEL. As a result, in the light-emitting apparatus 1, the current flowing through the VCSEL is less susceptible to the inductance of the current route. In the example illustrated in FIG. 6, since current begins to flow through the VCSEL around the time responses to the inductances L1 and L2 are completed, the current flowing through the VCSEL (solid line) increases steeply with little or no effect of the inductances L1 and L2.

Moreover, in the light-emitting apparatus 1, because the capacitive unit 20 is discharged after being charged to the upper limit, and current due to the discharge flows as a drive current to the VCSEL, an increase in the current flowing through the VCSEL is steep.

As described above, since the light-emitting apparatus 1 includes the capacitive unit 20 having the electrostatic capacitance $C_1$, the time from when current is first consumed by the light emission of the VCSEL until the predetermined power is reached is shorter than that in the conventional light-emitting apparatus 1'.

More specifically, in the light-emitting apparatus 1 according to the first exemplary embodiment, the anode electrode 101 and the cathode electrode 102 are provided with the region 101B and the region 102B, which function as the capacitive unit 20 having the electrostatic capacitance $C_1$. In the conventional light-emitting apparatus 1' not equipped with the capacitive unit 20, providing the region 101B and the region 102B and making the area of the region 101B and the region 102B 20% or more of the area of the region 101A and the region 102A will simply be an increase in the apparatus size and is unfavorable.

Second Exemplary Embodiment

In the first exemplary embodiment described above, the capacitive unit 20 is configured by providing the region 101B extending outside the anode electrode 101. A second exemplary embodiment differs from the first exemplary embodiment in the point that an intermediate electrode 103 is provided between the anode electrode 101 and the cathode electrode 102, and the capacitive unit 20 includes the intermediate electrode 103 and the cathode electrode 102.

Figure 7:
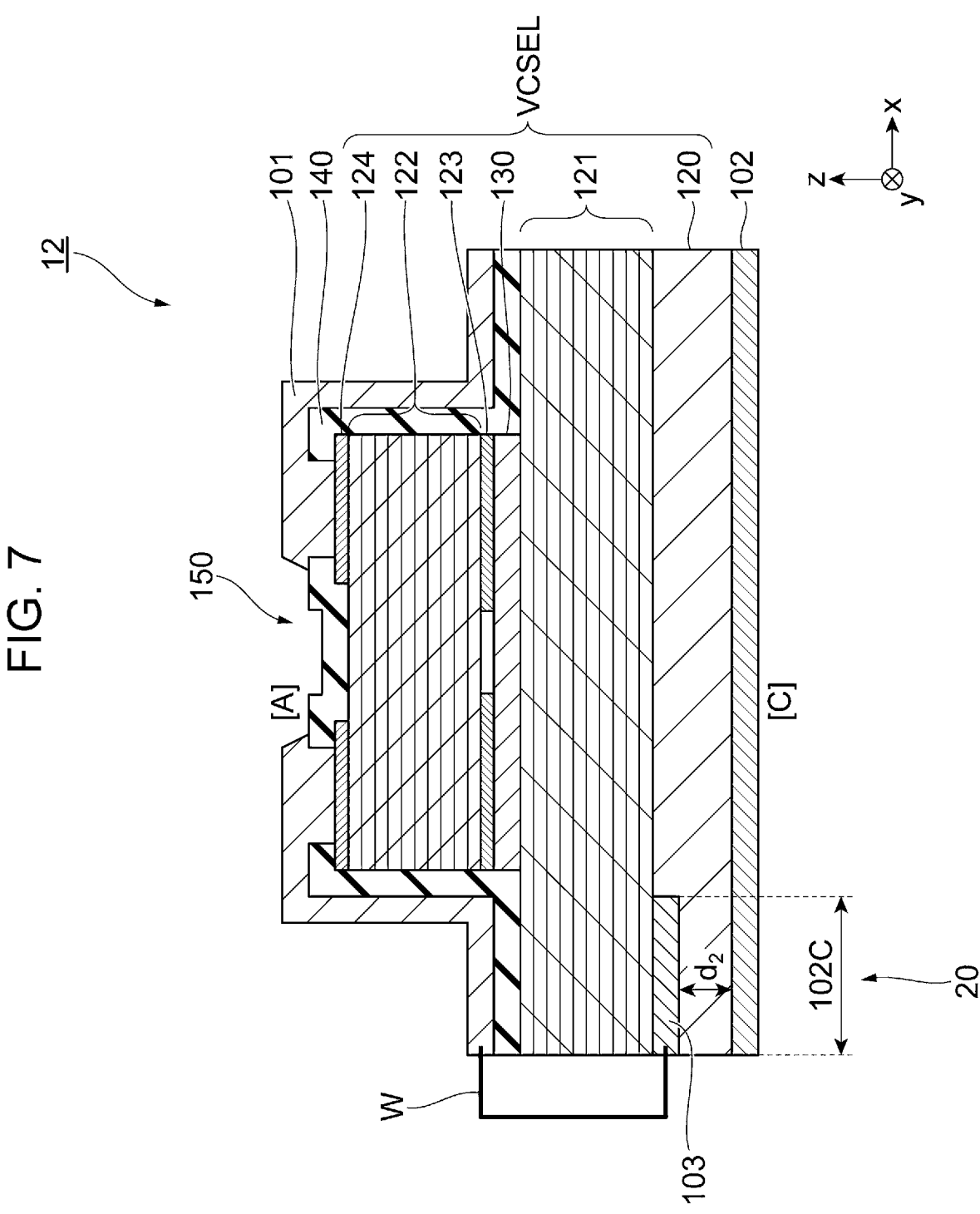
FIG. 7 is a diagram illustrating the cross-sectional structure of a light-emitting unit according to a second exemplary embodiment.

FIG. 7 is a diagram illustrating the cross-sectional structure of a light-emitting unit 12 according to the second exemplary embodiment. Note that, in FIG. 7, the same portions as those in FIG. 3 are denoted by the same reference numerals, and descriptions thereof are omitted.

As described above, the light-emitting unit 12 according to the second exemplary embodiment includes the intermediate electrode 103 between the anode electrode 101 and the cathode electrode 102. The intermediate electrode 103 is electrically connected to the anode electrode 101. In the example illustrated in FIG. 7, the intermediate electrode 103 and the anode electrode 101 are electrically connected by wiring W.

As illustrated in FIG. 7, the intermediate electrode 103 faces the cathode electrode 102. More specifically, the intermediate electrode 103 and a region 102C of the cathode electrode 102 face each other at a distance $d_2$, and may be regarded as two conductors facing each other across a dielectric body. Therefore, the intermediate electrode 103 and the region 102C have an electrostatic capacitance $C_2$ (see equation (1)) determined according to an area $S_2$ of a portion where the intermediate electrode 103 and the region 102C face each other and the distance $d_2$, and function as the capacitive unit 20. Moreover, the intermediate electrode 103 and the region 102C are regions having the electrostatic capacitance $C_2$, and are examples of a capacitive region.

Here, the electrostatic capacitance $C_2$ formed by the intermediate electrode 103 and the region 102C is determined according to the ratio $S_2/d_2$ of the area $S_2$ and the distance $d_2$. In the light-emitting unit 12, the distance $d_2$ is shortened by providing the intermediate electrode 103 between the anode electrode 101 and the cathode electrode 102. Therefore, even when the area $S_2$ is small, the ratio $S_2/d_2$ may be easily increased, and the electrostatic capacitance $C_2$ may be easily increased. That is, this contributes to the reduction of the apparatus size due to the reduction of the area $S_2$.

Although FIG. 7 illustrates an exemplary case in which the anode electrode 101, the lower reflector 121, and the cathode electrode 102 extend outside the VCSEL, and the intermediate electrode 103 is provided in the extending region, this is not the only possible structure. For example, any or all of the anode electrode 101, the lower reflector 121, and the cathode electrode 102 may be configured not to extend outside the VCSEL, and it is only necessary for the intermediate electrode 103 to be provided between the anode electrode 101 and the cathode electrode 102 facing each other.

Although FIG. 7 illustrates an exemplary case in which the intermediate electrode 103 is electrically connected to the anode electrode 101, the intermediate electrode 103 and the cathode electrode 102 may be electrically connected, and the capacitive unit 20 may be formed between the intermediate electrode 103 and the anode electrode 101. That is, it is only necessary that the intermediate electrode 103 be electrically connected to either one of the anode electrode 101 or the cathode electrode 102, and the capacitive unit 20 be formed between the intermediate electrode 103 and the other one of the anode electrode 101 or the cathode electrode 102.

Third Exemplary Embodiment

A third exemplary embodiment differs from the first exemplary embodiment in the point that there is provided a groove portion T, which shortens a distance $d_3$ between the anode electrode 101 and the cathode electrode 102.

Figure 8:
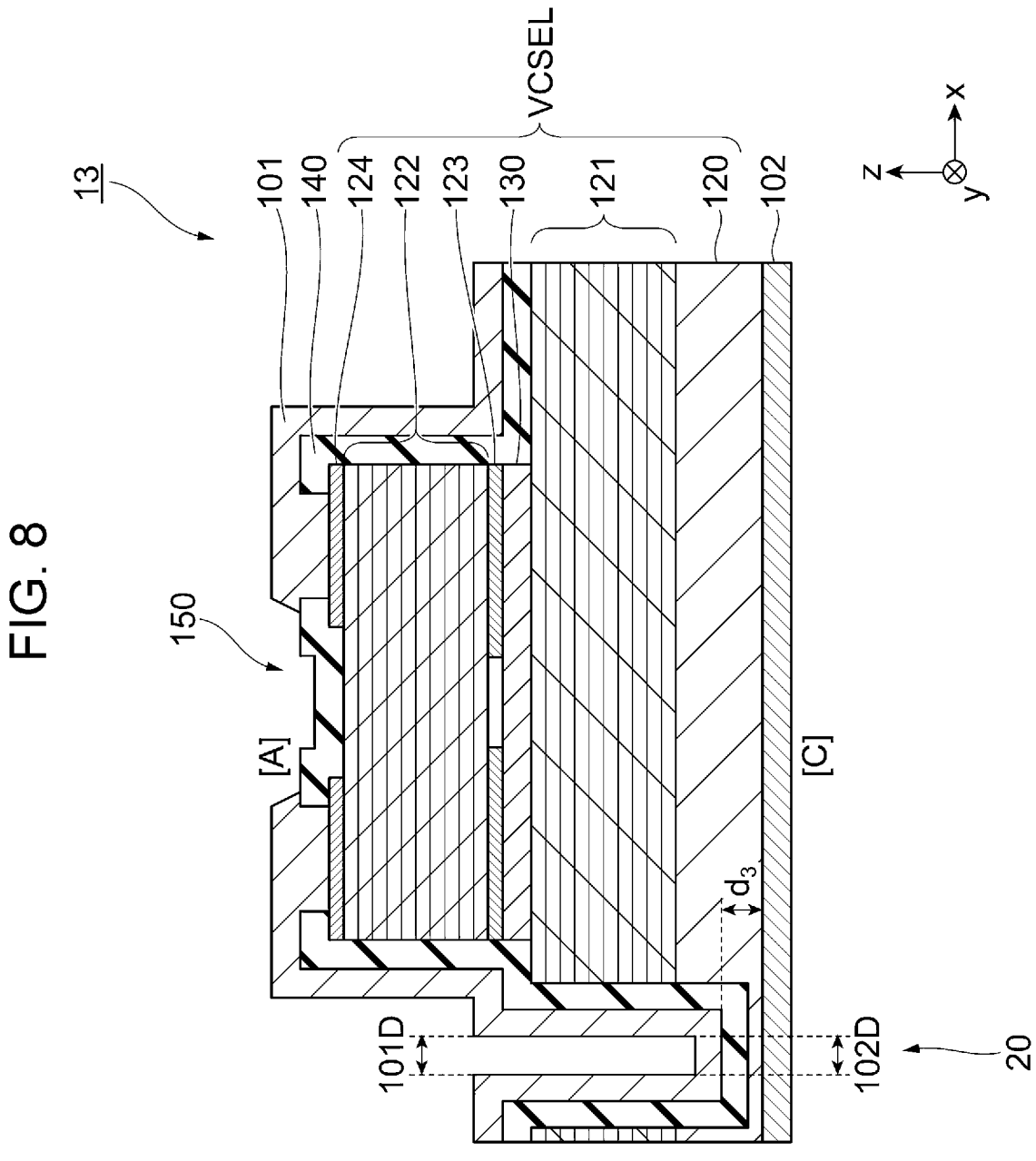
FIG. 8 is a diagram illustrating the cross-sectional structure of a light-emitting unit according to a third exemplary embodiment.

FIG. 8 is a diagram illustrating the cross-sectional structure of a light-emitting unit 13 according to the third exemplary embodiment. Note that, in FIG. 8, the same portions as those in FIG. 3 are denoted by the same reference numerals, and descriptions thereof are omitted.

In the example illustrated in FIG. 8, the groove portion T is provided as a groove shape that intrudes into the lower reflector 121 and the semiconductor substrate 120 in a region where the anode electrode 101 and the cathode electrode 102 extend outside the VCSEL and face each other. The groove-shaped side surfaces and the bottom surface of the groove portion T are covered by the insulating film 140 and the anode electrode 101.

Here, a region 101D of the anode electrode 101 covering the bottom surface of the groove shape and a region 102D of the cathode electrode 102 facing the bottom surface of the groove shape face each other at the distance $d_3$. That is, the region 101D and the region 102D are examples of a non-conductive region having an electrostatic capacitance $C_3$ (see equation (1)) determined according to an area $S_3$ of a portion where the regions 101D and 102D face each other and the distance $d_3$, and function as the capacitive unit 20.

The distance $d_3$ between the region 101D and the region 102D is shortened compared to the distance in the case where the groove portion T is not provided. Because the electrostatic capacitance $C_3$ is determined according to the ratio $S_3/d_3$ of the area $S_3$ and the distance $d_3$, the electrostatic capacitance $C_3$ may be increased by deepening the groove portion T and reducing the distance $d_3$. That is, because the electrostatic capacitance $C_3$ may be increased without increasing the area of a portion extending outside the VCSEL in the anode electrode 101 and the cathode electrode 102, an increase in the area of the light-emitting unit 13 is not necessary.

As described above, the light-emitting units 10 and 12 according to the first and second exemplary embodiments are provided in parallel with the route R, and include a capacitive region configured by including at least one of the anode electrode 101 or the cathode electrode 102.

Moreover, the light-emitting unit 13 according to the third exemplary embodiment is provided in parallel with the route R and includes non-conductive regions having the electrostatic capacitance $C_3$.

As described above, the light-emitting units 10, 12, and 13 according to the first, second, and third exemplary embodiments are examples of a light-emitting device including a capacitive region or a non-conductive region.

Fourth Exemplary Embodiment

In the first, second, and third exemplary embodiments described above, the capacitive unit 20 includes at least one of the anode electrode 101 or the cathode electrode 102. In other words, the light-emitting units 10, 12, and 13 and the capacitive unit 20 are configured by sharing at least one of the anode electrode 101 or the cathode electrode 102.

The fourth exemplar embodiment differs from the first exemplary embodiment in the point that the light-emitting unit 10 and the capacitive unit 20 do not share a common portion. More specifically, the capacitive unit 20 according to the fourth exemplary embodiment is a capacitive element provided as a member separate from the light-emitting unit 10 and is connected in parallel with the current route R in the light-emitting unit 10. Here, the capacitive element is an element having an electrostatic capacitance such as a so-called capacitor or the like. In addition, an element such as a thyristor having an electrostatic capacitance also functions as a capacitive element.

Moreover, since the light-emitting unit 10 according to the fourth exemplary embodiment does not share a common portion with the capacitive unit 20, the same light-emitting unit 10 as that in the conventional light-emitting apparatus 1' may be used, for example. Therefore, in the light-emitting apparatus 1 to which the fourth exemplary embodiment is applied, the complexity of the light-emitting unit 10 is suppressed compared to the case where the light-emitting unit 10 and the capacitive unit 20 share a common portion.

In the second, third, and fourth exemplary embodiments described above, because the capacitive unit 20 is provided, the time from when current is first consumed by the light emission of the VCSEL until the predetermined power is reached is shorter than that of the conventional light-emitting apparatus 1'.

Application Example

Next, using FIGS. 9 and 10, an application example in the case where the light-emitting apparatus 1 to which the first exemplary embodiment is applied is provided with a switch element will be described. Here, the case where a p-channel metal-oxide semiconductor (PMOS) element P1, which is an example of a switch element, is provided will be described.

Figure 9:
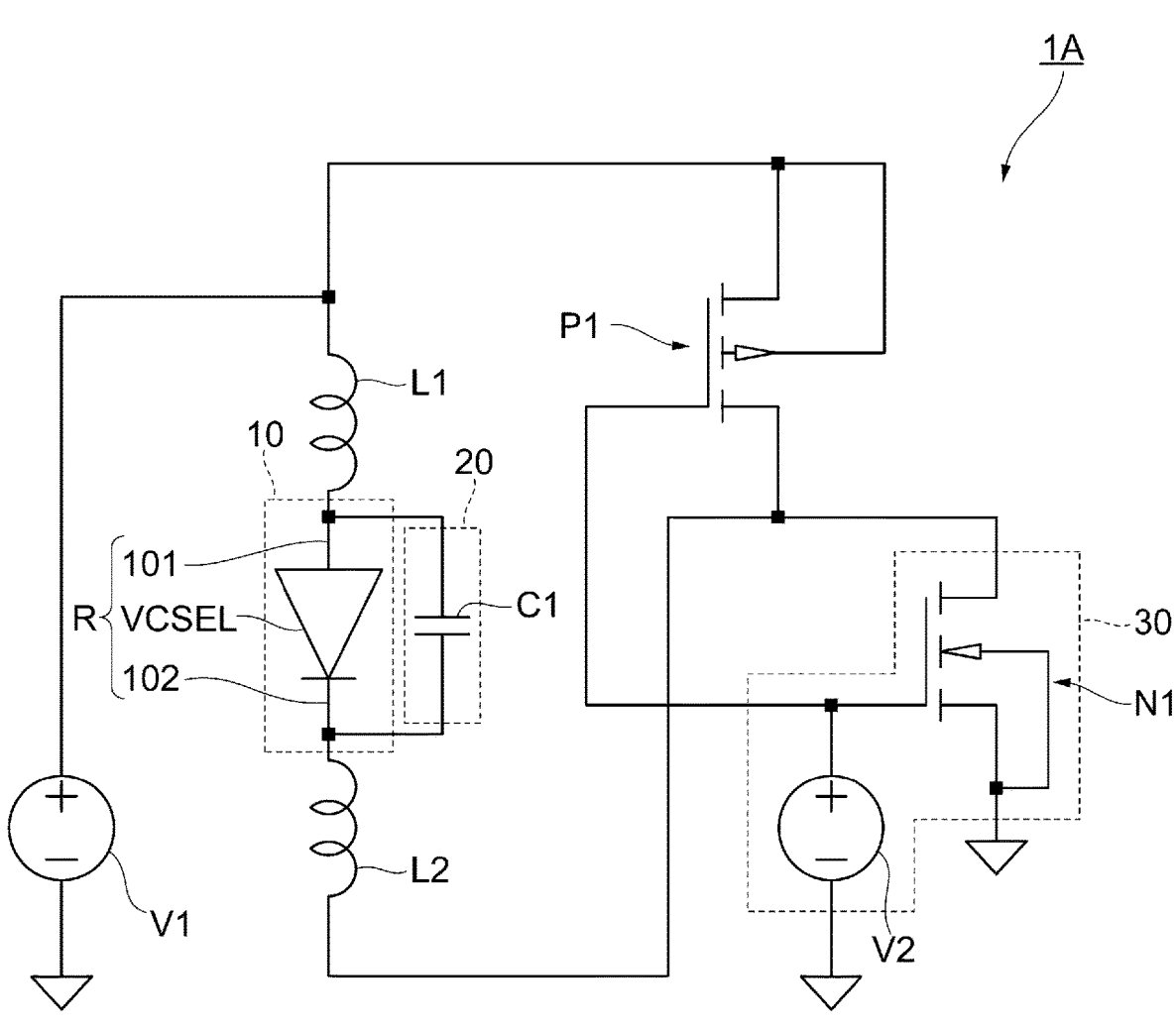
FIG. 9 is a diagram illustrating a light-emitting apparatus of an application example in which the light-emitting apparatus is provided with a switch element.

FIG. 9 is a diagram illustrating a light-emitting apparatus 1A of the application example in which the light-emitting apparatus 1 is provided with the switch element, and is an equivalent circuit diagram of the light-emitting apparatus 1A. Note that, in FIG. 9, the same portions as those in FIG. 4 are denoted by the same reference numerals, and descriptions thereof are omitted.

As illustrated in FIG. 9, in the light-emitting apparatus 1A, the PMOS element P1 is connected between the power supply V1 connected to the anode electrode 101 and the cathode electrode 102. More specifically, the source of the PMOS element P1 is connected to the power supply V1, and the drain is connected to the anode electrode 101. In addition, the gate of the PMOS element P1 is connected to the signal generation circuit V2, and is supplied with a control signal.

The PMOS element P1 is switched on during a period in which the NMOS element N1 is off. That is, if the control signal generated by the signal generation circuit V2 is at "L level", the NMOS element N1 is switched off, and the PMOS element P1 is switched on. In contrast, if the control signal generated by the signal generation circuit V2 is at "H level", the NMOS element N1 is switched on, and the PMOS element P1 is switched off.

Here, the PMOS element P1 has a resistance value generated between the drain and the source when the PMOS element P1 is in the on state, that is, an on-resistance.

Figure 10:
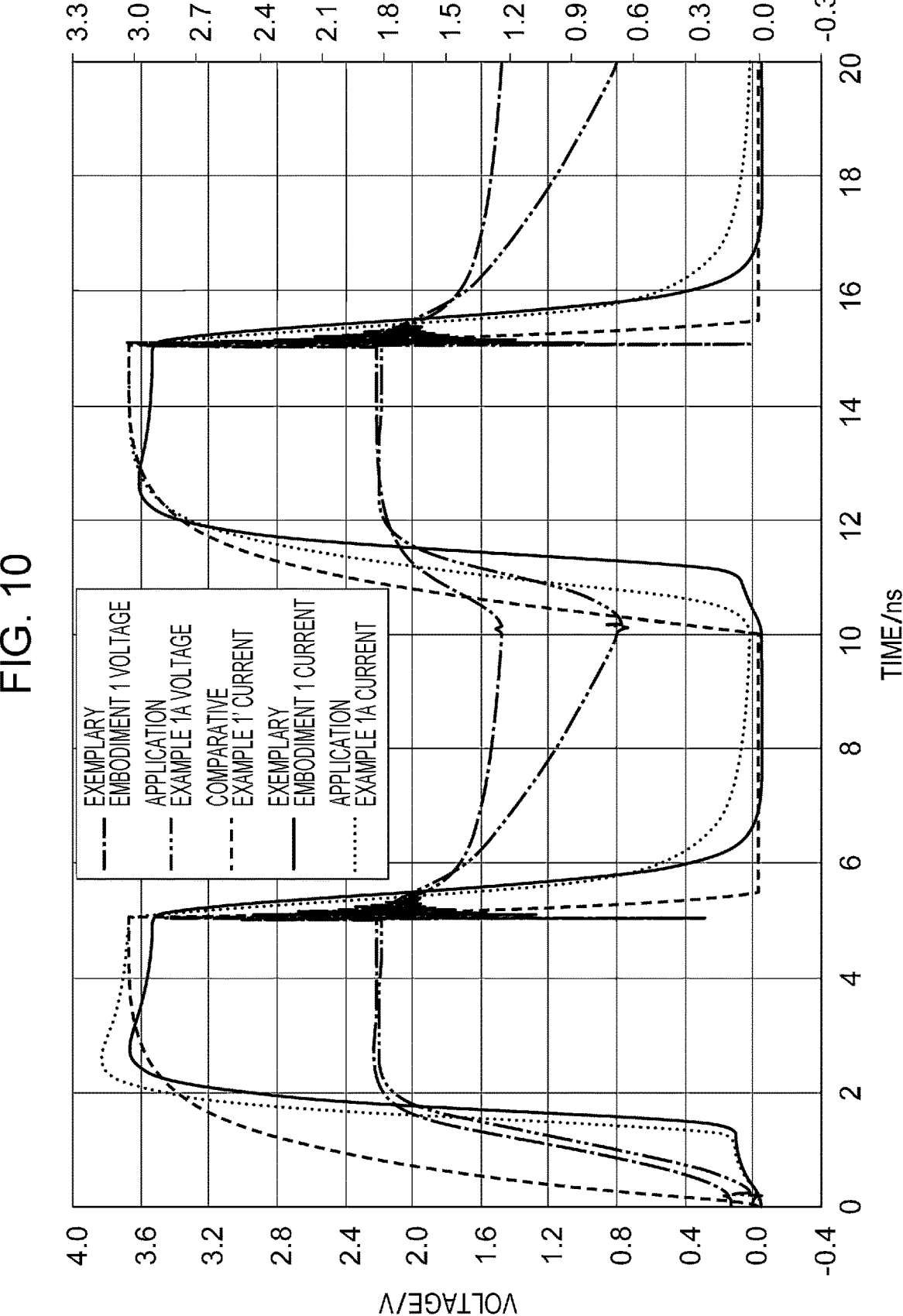
FIG. 10 is a diagram illustrating the result of calculating a drive current flowing through a VCSEL in the light-emitting apparatus of the application example.

FIG. 10 is a diagram illustrating the result of calculating a drive current flowing through the VCSEL in the light-emitting apparatus 1A of the application example. More specifically, FIG. 10 illustrates, besides the current flowing through the VCSEL of the light-emitting apparatus 1A (dotted line, and "application example 1A current" in the legend), the current flowing through the VCSEL of the light-emitting apparatus 1 (solid line, and "exemplary embodiment 1 current"), the current flowing through the VCSEL of the conventional light-emitting apparatus 1' (dashed line, and "comparative example 1' current"), the voltage of the capacitive unit 20 of the light-emitting apparatus 1A (dashed double-dotted line, and "application example 1A voltage"), and the voltage of the capacitive unit 20 of the light-emitting apparatus 1 (dotted line, and "exemplary embodiment 1 voltage").

As in FIG. 6, FIG. 10 illustrates the results of calculation based on the following: the power supply potential of the power supply V1 is 3.3 V; the inductance L1 is 0.3 nH and the inductance L2 is 0.2 nH; and the control signal generated by the signal generation circuit V2 is 0 V at "L level" and 1.8 V at "H level", and the rise time of the pulse of the control signal is 0.5 ns, the fall time is 0.5 ns, the on time is 4.5 ns, and the cycle is 10 ns. That is, it is assumed that the signal generation circuit V2 generates a control signal with a pulse width of 5 ns, a duty ratio of 50%, and a cycle of 10 ns. Moreover, the results are calculated assuming that the electrostatic capacitance $C_1$ is 2000 pF.

Here, as described using FIG. 6, in the first pulse, the time from when the current is first consumed by the light emission of the VCSEL of the light-emitting apparatus 1 until the maximum value within the pulse is reached is shorter than that in the conventional light-emitting apparatus 1'. That is, in the first pulse, an increase in the current flowing through the VCSEL of the light-emitting apparatus 1 is steeper than an increase in the current in the conventional light-emitting apparatus 1'.

However, in the second pulse, an increase in the current flowing through the VCSEL of the light-emitting apparatus 1 is moderate. This is likely because the control signal generated by the signal generation circuit V2 has a high duty ratio and the period between the first pulse and the second pulse is short, and thus the discharge of the capacitive unit 20 is not completed before the second pulse occurs.

That is, if the duty ratio is high, such as in the case of performing control with a duty ratio of 50% as used in the calculation in FIG. 6, an increase in the current flowing through the VCSEL of the light-emitting apparatus 1 may be moderate in the second and subsequent pulses, and the time until the VCSEL reaches the predetermined power may be longer. Therefore, it may be necessary to elongate the pulse repetition cycle (duty ratio) in order to satisfy the accuracy required for the ToF sensor 100.

In contrast, the current flowing through the VCSEL of the light-emitting apparatus 1A of the application example (dotted line in FIG. 10) increases steeply even in the second pulse. More specifically, in the first and second pulses, the time from when the current is first consumed by the light emission of the VCSEL until the maximum value within the pulse is reached in the light-emitting apparatus 1A of the application example is shorter than that in the light-emitting apparatus 1 and the conventional light-emitting apparatus 1'.

Therefore, in the light-emitting apparatus 1A of the application example, the pulse repetition cycle (duty ratio) may be shortened compared to the light-emitting apparatus 1 not equipped with the PMOS element P1.

The difference between the current flowing through the VCSEL of the light-emitting apparatus 1A of the above application example (dotted line) and the current flowing through the VCSEL of the light-emitting apparatus 1 (solid line) will be described as follows.

In the light-emitting apparatus 1A of the application example, in a period in which the control signal corresponding to the first pulse reaches L level and the NMOS element N1 is switched off, the PMOS element P1 is switched on. At the time the PMOS element P1 is switched on, the charge stored in the capacitive unit 20 is discharged and consumed. That is, the discharge of the capacitive unit 20 is promoted because the PMOS element P1 is switched on. As a result, the discharge of the capacitive unit 20 is completed by the time the H-level control signal corresponding to the second pulse is supplied, and, even in the second pulse, the time from when the current is first consumed by the light emission of the VCSEL until the maximum value within the pulse is reached is shortened.

Here, if the on-resistance of the PMOS element P1 is too small for the on-resistance of the NMOS element N1, the promotion of the discharge of the capacitive unit 20 may be insufficient, and the time until the VCSEL reaches the predetermined power may not be shortened. Therefore, the on-resistance of the PMOS element P1 is set to be larger than, such as five times or more of, the on-resistance of the NMOS element N1. However, since the time required for discharging the capacitive unit 20 is determined by the time constant of the capacitive unit 20, if the time constant is small and the time required for discharging is short, the on-resistance of the PMOS element P1 may be set to be smaller than the on-resistance of the NMOS element N1.

In this manner, the on-resistance of the PMOS element P1 provided in the light-emitting apparatus 1A of the application example is set to be, for example, five times or more of the on-resistance of the NMOS element N1.

As described thus far, in the light-emitting apparatus 1, by providing the PMOS element P1, which is connected between the power supply V1 connected to the anode electrode 101 and the cathode electrode 102 and which is switched on in a period in which the NMOS element N1 is off, the pulse repetition cycle may be shortened compared to the case in which the PMOS element P1 is not provided.

In the second, third, and fourth exemplary embodiments, the same effect may be achieved by providing the same PMOS element P1.

Modifications

Although the first, second, third, and fourth exemplary embodiments and the application example described above discuss an exemplary case where the NMOS element N1 is used as an example of a first element, an element such as an insulated gate bipolar transistors (IGBT) may also be used. In general, however, IGBT is an element used for switching at a slower speed than NMOS, and when high-speed switching is required as in a measuring apparatus based on the ToF method, NMOS is more favorable to use.

Although the first, second, third, and fourth exemplary embodiments and the application example described above discuss an exemplary case in which the anode electrode 101 is provided on the upper side of the VCSEL, and the cathode electrode 102 is provided on the lower side, the polarity of the semiconductor layer may be replaced, and the anode electrode 101 and the cathode electrode 102 may be configured in reverse.

Furthermore, although the case where the VCSEL is used as the light-emitting element has been discussed, a light-emitting diode (LED), a laser diode (LD), or the like may be used instead of the VCSEL.

Although the exemplary embodiments of the present disclosure have been described thus far, the technical scope of the present disclosure is not limited to the scope described in the above-described exemplary embodiments. It is apparent from the claims that combinations of two or more of the above-described exemplary embodiments, as well as various changes or improvements to the above-described exemplary embodiments, are also included in the technical scope of the present disclosure.

The foregoing description of the exemplary embodiments of the present disclosure has been provided for the purposes of illustration and description. It is not intended to be exhaustive or to limit the disclosure to the precise forms disclosed. Obviously, many modifications and variations will be apparent to practitioners skilled in the art. The embodiments were chosen and described in order to best explain the principles of the disclosure and its practical applications, thereby enabling others skilled in the art to understand the disclosure for various embodiments and with the various modifications as are suited to the particular use contemplated. It is intended that the scope of the disclosure be defined by the following claims and their equivalents.

What is claimed is:

1. A light-emitting apparatus comprising:
a light-emitting element with a cathode electrode and an anode electrode;
a driver including a first element connected to the cathode electrode on a cathode side of the light-emitting element, the driver being configured to drive the light-emitting element by supplying current that causes light emission; and
a capacitive region in which a direction between two conductors that provide capacitance is physically in parallel with a route through which the current that causes light emission flows between the anode electrode on an anode side of the light-emitting element and the cathode electrode, wherein the capacitive region shares the cathode electrode and the anode electrode with the light-emitting element, wherein the cathode electrode forms a first capacitor electrode in the capacitive region and the anode electrode forms a second capacitor electrode in the capacitive region, and a switch connected between a power supply potential connected to the anode electrode and the cathode electrode, the switch being switched on during a period in which the first element is off, wherein an on-resistance of the switch is greater than an on-resistance of the first element.

2. The light-emitting apparatus according to claim 1, wherein the on-resistance of the switch is five times or more of the on-resistance of the first element.

3. A measuring apparatus comprising:
the light-emitting apparatus according to claim 1; and
a sensor configured to receive light emitted by the light-emitting apparatus and reflected from a target,
the measuring apparatus being configured to measure a three-dimensional shape of the target.

\* \* \* \* \*